(12) United States Patent
Hsu

(10) Patent No.: US 6,407,930 B1
(45) Date of Patent: Jun. 18, 2002

(54) STRUCTURE OF PRINTED CIRCUIT BOARD WITH STACKED DAUGHTER BOARD

(75) Inventor: Hsien-Yueh Hsu, Taipei (TW)

(73) Assignee: ASUSTek Computer Inc., Taipei (TW)

( * ) Notice: Subject to any disclaimer, the term of this patent is extended or adjusted under 35 U.S.C. 154(b) by 0 days.

(21) Appl. No.: 09/350,954

(22) Filed: Jul. 9, 1999

(30) Foreign Application Priority Data

Jun. 23, 1999 (TW) ........................................ 88110533 A

(51) Int. Cl.[7] ................................................ H05K 1/14
(52) U.S. Cl. ...................... 361/784; 361/780; 361/777; 361/794; 361/803; 174/255; 174/261; 174/263; 439/69; 439/74
(58) Field of Search ................................. 361/786, 748, 361/736, 750, 751, 780, 777, 794, 795, 803; 439/59, 66, 65, 69, 74; 174/255, 261, 262, 263, 266

(56) References Cited

U.S. PATENT DOCUMENTS

| | | | | |
|---|---|---|---|---|
| 4,803,450 A | * | 2/1989 | Burgess et al. ............. | 333/238 |
| 5,097,390 A | * | 3/1992 | Gerrie et al. ................ | 361/784 |
| 5,434,745 A | * | 7/1995 | Shokrgozar et al. ........ | 361/735 |
| 5,657,208 A | * | 8/1997 | Noe et al. .................... | 361/790 |
| 5,719,750 A | * | 2/1998 | Iwane ......................... | 361/794 |
| 5,729,440 A | * | 3/1998 | Jimarez et al. ............. | 361/779 |
| 5,926,377 A | * | 7/1999 | Nakao et al. ............... | 361/763 |
| 6,094,354 A | * | 7/2000 | Nakajoh et al. ............ | 361/760 |
| 6,121,554 A | * | 9/2000 | Kamikawa .................. | 174/260 |

* cited by examiner

Primary Examiner—Leo P. Picard
Assistant Examiner—David Foster
(74) Attorney, Agent, or Firm—Rabin & Berdo, P.C.

(57) ABSTRACT

A structure of a printed circuit board with stacked daughter board. The structure has a motherboard and at least a daughter board. The motherboard has a first signal layer, a second signal layer, a first power layer, a first ground layer and isolation layers between every layer. The first signal layer and the second signal layer serve as surfaces of the motherboard and first contacts are formed on the first signal layer. The daughter board includes a third signal layer, a fourth signal layer, a second power layer, a second ground layer and isolation layers between every layer. The second power layer or the second ground layer serves as a surface of the daughter board and second contacts are formed on the surface. The daughter board is stacked on the motherboard and the second contacts are coupled with the first contacts.

19 Claims, 4 Drawing Sheets

STRUCTURE OF PRINTED CIRCUIT BOARD WITH STACKED DAUGHTER BOARD

CROSS-REFERENCE TO RELATED APPLICATION

This application claims the priority benefit of Taiwan application serial no. 88110533, filed Jun. 23, 1999, the full disclosure of which is incorporated herein by reference.

BACKGROUND OF THE INVENTION

1. Field of Invention

The present invention relates to a structure of a printed circuit board. More particularly, the present invention relates to a structure of a printed circuit board with a stacked daughter board.

2. Description of Related Art

After devices are packaged, the devices are mounted on a substrate such as a printed circuit board for coupling with other devices; the most common application is a mainboard or motherboard.

FIG. 1 is a schematic diagram of a conventional mainboard.

Referring to FIG. 1, devices such as a microprocessor 12, a chip 14 and a slot 16 are mounted on a mainboard 10 that is usually a four-layer printed circuit board. The microprocessor 12 is used to run programs and the chip 14 is a communication bridge between the microprocessor 12 and the slot 16 or the microprocessor 12 and other devices. The slot 16 is for an expansion card such as a network card or a sound card. The devices are coupled with each other by traces 18 for transmitting data.

Since the amount of data transmitted between each device is different, the number of traces 18 between any two devices is also different. This means that the distribution of the trace density on the mainboard 10 is not even. For example, the trace density of trace region 20 between the microprocessor 12 and the chip 14 is high, because most data are transmitted between the microprocessor 12 and the chip 14. In contrast, the trace density in trace region 22 between the chip 14 and the slot 16 is low, because fewer data are transmitted between the chip 14 and the slot 16.

With the increasing power of the microprocessor and the increasing number of devices, the number of traces on the mainboard must increase to deal with more data transmitted between devices. This means that the distribution of the trace density on the mainboard becomes worse; the high trace density region becomes denser. However, the area of the mainboard for forming the traces is fixed, therefore the trace density is limited. When the trace density exceeds the limit, the layout of the traces cannot be formed on the general four-layer printed circuit board, and a printed circuit board having more layers is needed. However, dense traces are only formed in some regions and the cost of the printed circuit board having more layers is high, so the cost of achieving the high density trace layout is increased by using a printed circuit board having more layers.

SUMMARY OF THE INVENTION

The invention provides a structure of a printed circuit board with stacked daughter board. The structure of the printed circuit board is a daughter board stacked on a high trace density region of a mainboard or motherboard, so that a high-density trace layout is achieved. Additionally, by using the daughter board, the trace layout is flexible because a bridge circuit is formed by the daughter board, so that circuits on the motherboard can be changed by changing the daughter board. Moreover, design of the printed circuit board is modularized by using the daughter board.

As embodied and broadly described herein, the invention provides a structure of a printed circuit board with stacked daughter board. The structure includes a motherboard and at least a daughter board. The motherboard comprises two signal layers plus a power layer, and a ground layer. Isolation layers separate each of the layers. The signal layers serve as surfaces of the motherboard and contacts are formed on one of the signal layers. The daughter board also comprises two signal layers plus a power layer, and a ground layer. Isolation layers separate each of the layers. The power layer or the ground layer serves as a surface of the daughter board and contacts are formed on the surface. The surface of the daughter board formed by the ground layer or the power layer is stacked on the motherboard and the daughter board contacts are coupled with the motherboard contacts.

In another embodiment grooves are formed on opposite sides of the daughter board. The inner surface of each groove and a region around each groove are covered with a conductive layer. The surface of the daughter board formed by the ground layer or the power layer is stacked on the motherboard. The grooves on the daughter board are coupled with the contacts on the motherboard.

The daughter board is stacked on the motherboard so the high-density trace layout can be achieved for the motherboard. Furthermore, the design of the printed circuit board assembly made from the motherboard and the daughter board becomes flexible and modularized because the function of the printed circuit board is easily changed by changing the daughter board.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
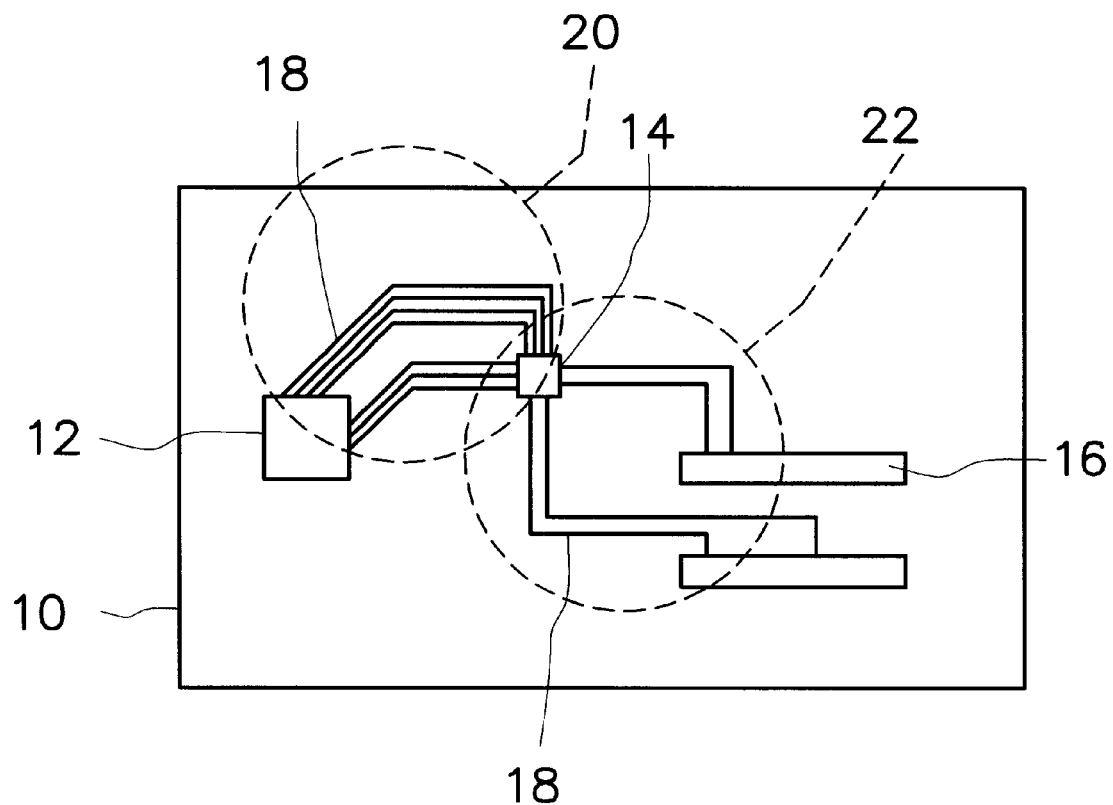
FIG. 1 is a schematic diagram of a conventional mainboard.
Figure 2A:
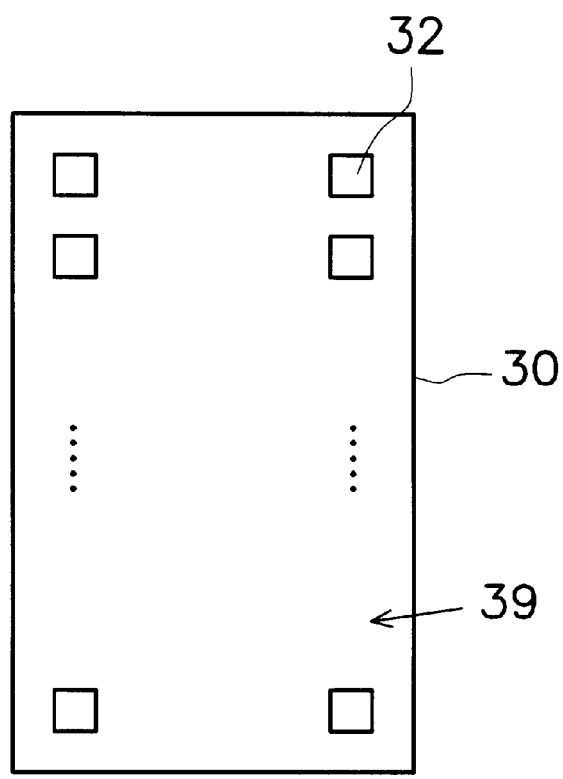
FIG. 2A is a schematic, top view of a daughter board according to an embodiment of the invention.
Figure 2B:
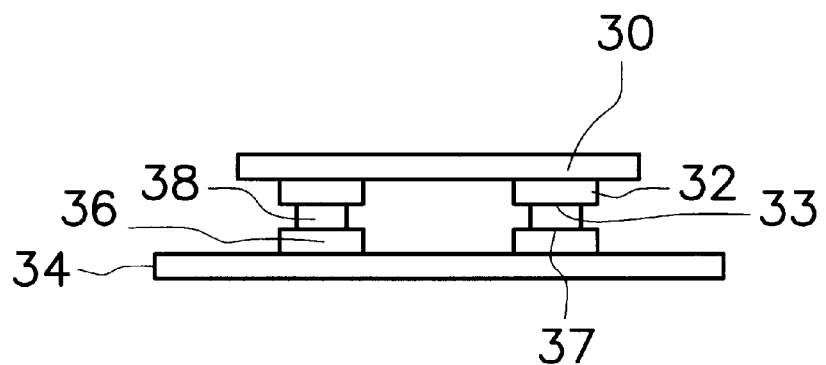
FIG. 2B is a schematic, cross-sectional diagram of the daughter board in FIG. 2A stacked on a motherboard.

FIG. 2A is a schematic, top view of a daughter board according to an embodiment of the present invention, and FIG. 2B is a schematic, cross-sectional diagram of the daughter board shown in FIG. 2A stacked on a motherboard.

Referring to FIG. 2A and FIG. 2B, a daughter board 30 comprises a four-layer printed circuit board, a six-layer printed circuit board, an eight-layer printed circuit board or a ten-layer printed circuit board, wherein each printed circuit board includes at least a signal layer, at least a ground layer and at least a power layer, and traces are formed on the signal layer. Isolation layers are placed between every layer. The layers separated by the isolation layers are coupled with each other by through-holes in the isolation layers. In an embodiment of the invention, the ground layer or the power layer serves as a surface 39 of the daughter board 30. Contacts 32, for example, arranged in two rows, are formed on the surface 39 and a conductive material 33 such as a tin/lead alloy is applied on each of the contacts 32. Contacts 36 are formed in a region of the motherboard 34 for coupling with the daughter board 30. The region of the motherboard 34 in which the contacts 36 are formed is preferably a high trace density region. The arrangement of the motherboard contacts 36 is the same as that of the daughter board contacts 32. A conductive material 37, comprising a tin/lead alloy, is applied on each of the contacts 36.

While stacking the daughter board 30 on the motherboard 34, a solder paste 38 is applied on each of the contacts 32 and 36. Then, the daughter board 30 is stacked on the motherboard 34 and the contacts 32 are aligned with the contacts 36. A thermal process such as infrared reflow is performed.

In the invention, a high-density trace layout on the motherboard is achieved by stacking a daughter board on the motherboard.

Figure 3:
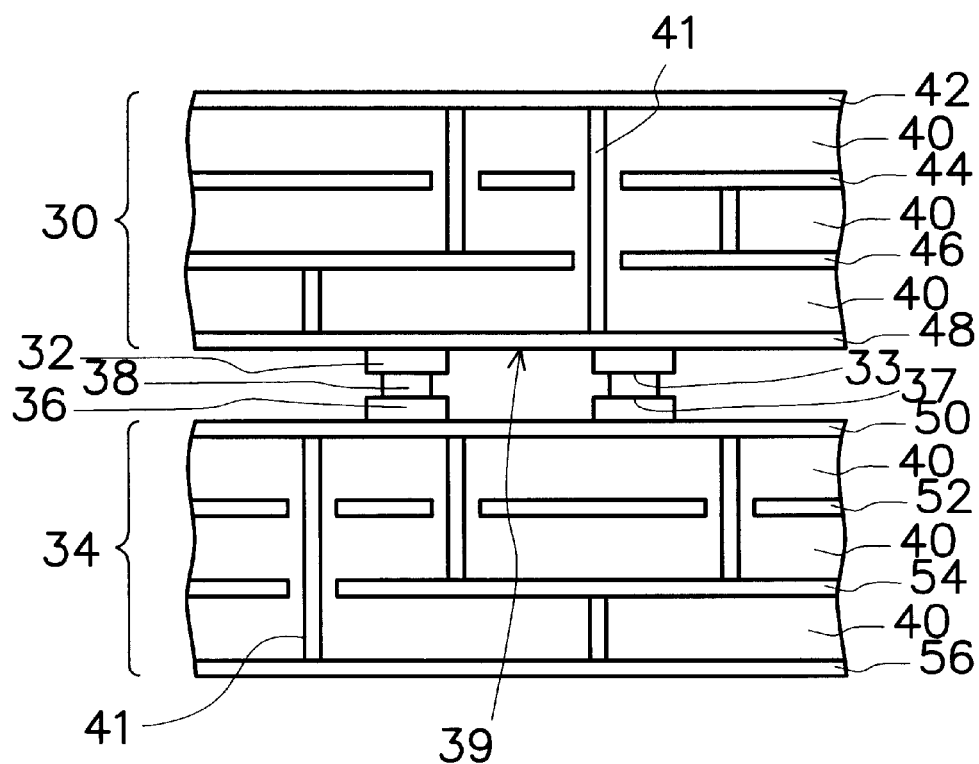
FIG. 3 is an enlargement of FIG. 2B.

FIG. 3 is an enlargement of FIG. 2B.

Referring to FIG. 3, a general four-layer printed circuit board comprising two signal layers, a ground layer and a power layer, in which the signal layers serve as surfaces of the printed circuit board. The signal layers are separated by the ground layer and the power layer to avoid a crosstalk effect, which occurs when the space between the signal layers is thin. As a result, the structure of the motherboard or the daughter board in this invention can be modified to avoid the crosstalk effect.

For example, in an embodiment, the daughter board 30 and the motherboard 34 are both four-layer printed circuit boards. The motherboard 34 uses a conventional design. Signal layers 50 and 56, on which traces (not shown) are formed, serve as a surface of the motherboard 34. The signal layers 50 and 56 are separated by a power layer 52 and a ground layer 54. Isolation layers 40 are placed between every layer. The layers separated by the isolation layers 40 are coupled with each other by through-holes 41 in the isolation layers 40.

A ground layer 48, a signal layer 46, a power layer 44 and a signal layer 42 are stacked in sequence to form the daughter board 30. Isolation layers 40 are placed between every layer and the layers separated by the isolation layers 40 are coupled with each other by through-holes 41 in the isolation layers 40. By this structure of the daughter board 30, the distance between the signal layer 46 on the daughter board and the signal layer 50 on the motherboard is enlarged when the daughter board 30 is stacked on the motherboard 34, so the crosstalk effect is avoided. This structure of the daughter board 30 is only used to describe the invention and the invention is not restricted by the embodiments. Other designs, in which the surface of the daughter board stacked on the motherboard is not a signal layer, are also suitable for this invention.

When a daughter board having more layers is used, the design of the daughter board is the same in that the surface of the daughter board stacked on the motherboard should not be the signal layer. The reasoning is that either the stacking surface of the daughter board or the stacking surface of the motherboard is a signal layer. However, a design in which neither the stacking surface of the daughter board nor the stacking surface of the motherboard is a signal layer is also suitable.

Figure 4A:
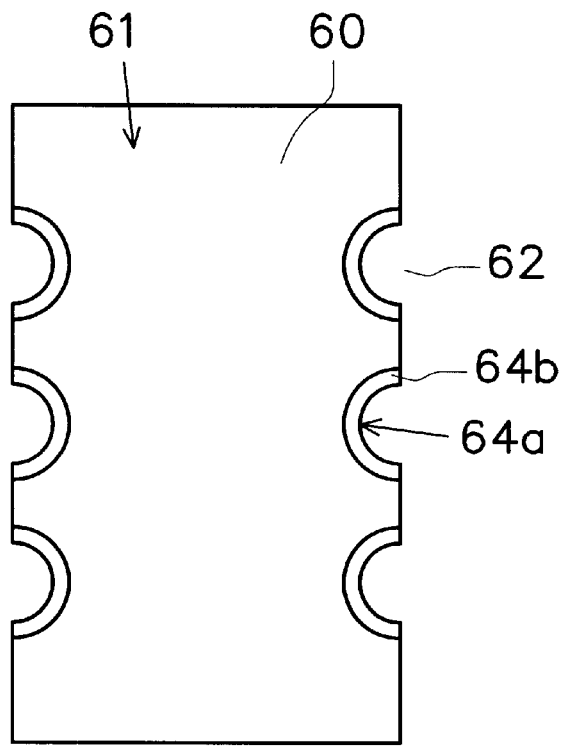
FIG. 4A is a schematic, top view of a daughter board according to an embodiment of the invention.
Figure 4B:
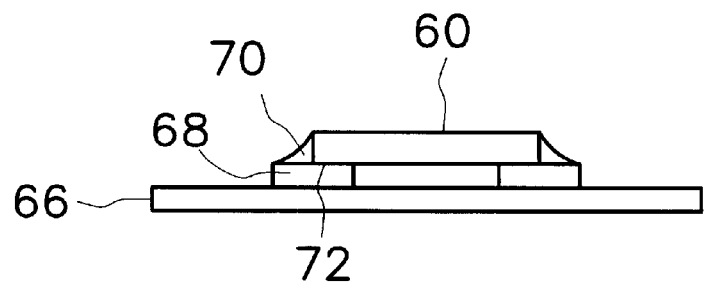
FIG. 4B is a schematic, cross-sectional diagram of the daughter board in FIG. 4A stacked on a motherboard.

FIG. 4A is a schematic, top view of a daughter board according to another embodiment of the present invention; FIG. 4B is a schematic, cross-sectional diagram of the daughter board in FIG. 4A stacked on a motherboard.

Referring to FIG. 4A and FIG. 4B, a daughter board 60 comprising a four-layer printed circuit board, a six-layer printed circuit board, an eight-layer printed circuit board or a ten-layer printed circuit board, wherein each printed circuit board comprises at least a signal layer, at least a ground layer and at least a power layer. Traces are formed on the signal layer. Isolation layers are placed between every layer. The layers separated by the isolation layers are coupled with each other by through-holes in the isolation layers. In an embodiment of the present invention, the ground layer or the power layer serves as a surface 61 of the daughter board 60. Grooves 62 are formed on opposite sides of the daughter board 60. A conductive layer 64a is formed on the inner surface of each groove 62, and a conductive layer 64b is formed in a region, on both surfaces of the daughter board 60, around each groove 62. The conductive layer 64a and the conductive layer 64b are both made from a copper layer and a tin/lead alloy layer, for example. The conductive layer 64a and the conductive layer 64b improve adhesion between the grooves 62 and a solder paste applied on each groove 62 in a subsequent process. Contacts 68 are formed in a region of the motherboard 66 for coupling with the daughter board 60. The arrangement of the contacts 68 on the motherboard is the same as that of the grooves 62 on the daughter board. Also, a conductive material 72, comprising a tin/lead alloy, is applied on each of the contacts 68.

While stacking the daughter board 60 on the motherboard 66, a solder paste 70 is applied on each of the contacts 68. Then, the daughter board 60 is stacked on the motherboard 66 and the grooves 62 on the daughter board are aligned over the contacts 68 on the motherboard. A surface mounting technology process is performed. After the surface mounting technology process, the solder paste 70 adheres the grooves 62 and the contacts 68.

The structure of the daughter board 60 in this embodiment is modified according to the design concept mentioned above where the signal layers are separated by the ground layer and the power layer to avoid a crosstalk effect which occurs when the space between the signal layers is thin.

In the invention, the daughter board is stacked on the high trace density region of the motherboard, so a high-density trace layout can be achieved. By using the daughter board, a printed circuit board having only a few layers is capable of a high-density trace layout.

Furthermore, the design of the printed circuit board made from the motherboard and the daughter board becomes flexible and modularized because the function of the printed circuit board can be easily changed by changing the daughter board. For example, when the daughter board is a sound module, the printed circuit board is a sound card or when the daughter board is a video module, the printed circuit board is a video card.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure of a printed circuit board, the structure comprising:
   a motherboard having a first signal layer, a first ground layer, a first power layer, a second signal layer and isolation layers, wherein the first signal layer is a top surface and the second signal layer is a bottom surface of the motherboard and first contacts are formed on the top surface; and
   a daughter board having a third signal layer, a second ground layer, a second power layer, a fourth signal layer and isolation layers, wherein a bottom surface of the daughter board having second contacts is selected from either the second ground layer or the second power layer, grooves are formed on a pair of opposite sides of the daughter board, an inner surface of each groove and a region around each groove are covered by a conductive layer, the daughter board is stacked on a region of the top surface of the motherboard and the grooves are coupled with the first contacts;
   wherein the first contacts are coupled with the grooves by a conductive material; and
   wherein the conductive material comprises a solder paste.

2. The structure of claim 1, wherein the conductive material adheres the first contacts and the conductive layer.

3. The structure of claim 1, wherein the conductive layer is made from a copper layer and a tin/lead alloy layer.

4. A structure of a printed circuit board, the structure comprising:
   a motherboard having first signal layers, at least a first ground layer, at least a first power layer, and isolation layers, wherein one of the first signal layers serves as a top surface of the motherboard and first contacts are formed on the top surface; and
   a daughter board having second signal layers, at least a second ground layer, at least a second power layer, and isolation layers, wherein a bottom surface of the daughter board having second contacts is selected from either the second ground layer or the second power layer, an inner surface of each groove and a region around each groove are covered by a conductive layer, the daughter board is stacked on a region of the top surface of the motherboard and the grooves are coupled with the first contacts;
   wherein the first contacts are coupled with the grooves by a conductive material; and
   wherein the conductive material comprises a solder paste.

5. The structure of claim 4, wherein the conductive material adheres the first contacts and the conductive layer.

6. The structure of claim 4, wherein the conductive layer is made from a copper layer and a tin/lead alloy layer.

7. In combination,
   a motherboard, comprising:
      a first signal layer having at least one first signal trace thereon, said signal trace being adapted to transmit data signals to and from an associated electronic device, said signal layer forming a top surface of said motherboard;
      first contacts formed on said signal layer;
      a first ground layer coupled to said signal layer and serving as a ground potential; and
      a first power layer coupled to said signal layer for providing power; and a daughter board stacked over said motherboard, and comprising:
      a second signal layer having at least one second signal trace thereon, said second signal trace being adapted to transmit data signals;
      a further layer comprising either a second ground layer coupled to said second signal layer and serving as a ground potential, or a second power layer coupled to said second signal layer for providing power; and
      second contacts formed on said further layer, said second contacts being coupled with said first contacts;
      wherein said further layer forms a bottom surface of said daughter board; and
      wherein said first signal layer is separated from said second signal layer by said further layer to prevent a crosstalk effect between said first signal layer and said second signal layer.

8. The combination recited in claim 7, wherein said daughter board comprises both the second ground layer and the second power layer, said further layer being one of said second ground layer and said second power layer.

9. The combination recited in claim 7, further comprising a conductive material that couples said first contacts with said second contacts.

10. The combination recited in claim 9, wherein said conductive material comprises a solder paste.

11. The combination recited in claim 7, further comprising a tin/lead alloy layer formed on each of said first contacts and each of said second contacts.

12. The combination recited in claim 8, wherein said motherboard further comprises a plurality of first isolation layers, said first isolation layers separating said first signal layer, said first power layer, and said first ground layer from each other, and wherein said daughter board further comprises a plurality of second isolation layers, said second isolation layers separating said second signal layer, said second power layer, and said second ground layer from each other.

13. The combination recited in claim 7, wherein said motherboard further comprises a third signal layer forming a bottom surface of said motherboard.

14. The combination recited in claim 7, wherein said motherboard further comprises at least one additional power layer, at least one additional signal layer, and/or at least one additional ground layer.

15. The combination recited in claim 8, wherein said daughter board further comprises at least one additional power layer, at least one additional signal layer, and/or at least one additional ground layer.

16. The combination recited in claim 7, wherein said first ground layer serves as a ground potential for said first signal layer, and said first power layer provides power to said first signal layer.

17. The combination recited in claim 8, wherein said second ground layer serves as a ground potential for said second signal layer, and said second power layer provides power to said second signal layer.

18. The combination recited in claim 7, wherein said daughter board forms a bridge circuit for said motherboard.

19. The combination recited in claim 7, wherein said daughter board is disposed on a high trace density region of said motherboard.

* * * * *